(12) United States Patent
Bosscher

(10) Patent No.: US 10,298,232 B2
(45) Date of Patent: May 21, 2019

(54) TOUCH SWITCH FOR A CONTROL DEVICE OF AN ELECTRIC AND/OR ELECTRONIC APPARATUS

(71) Applicant: Electrolux Appliances Aktiebolag, Stockholm (SE)

(72) Inventor: Eric Bosscher, Rothenburg ob der Tauber (DE)

(73) Assignee: Electrolux Appliances Aktiebolag, Stockholm (SE)

( * ) Notice: Subject to any disclaimer, the term of this patent is extended or adjusted under 35 U.S.C. 154(b) by 340 days.

(21) Appl. No.: 14/899,682

(22) PCT Filed: Jun. 13, 2014

(86) PCT No.: PCT/EP2014/062323
§ 371 (c)(1),
(2) Date: Dec. 18, 2015

(87) PCT Pub. No.: WO2015/007437
PCT Pub. Date: Jan. 22, 2015

(65) Prior Publication Data
US 2016/0134284 A1  May 12, 2016

(30) Foreign Application Priority Data
Jul. 15, 2013  (EP) .................................... 13176441

(51) Int. Cl.
*H03K 17/96* (2006.01)
(52) U.S. Cl.
CPC ... *H03K 17/962* (2013.01); *H03K 2017/9602* (2013.01); *H03K 2217/960765* (2013.01); *H03K 2217/960785* (2013.01)

(58) Field of Classification Search
CPC ..... H03K 17/962; H03K 2217/960765; H03K 2217/960785; H03K 17/96; H03K 2017/9602
(Continued)

(56) References Cited

U.S. PATENT DOCUMENTS 4,090,092 A   5/1978 Serrano
5,760,715 A   6/1998 Senk et al.
(Continued)

FOREIGN PATENT DOCUMENTS

CN   101222220 A   7/2008
CN   102427357 A   4/2012
(Continued)

OTHER PUBLICATIONS

International Search Report for PCT/EP2014/062323, dated Jul. 7, 2014, 3 pages.
(Continued)

*Primary Examiner* — Felix O Figueroa
(74) *Attorney, Agent, or Firm* — Pearne & Gordon LLP

(57) ABSTRACT

The present invention relates to a touch switch of (10) for a control device of an electric and/or electronic apparatus. The touch switch (10) comprises a non conductive layer (14) made of an electrically non-conductive material or material composition, a touch sensor (12) arranged at a bottom side or rear side of the non conductive layer (14), a metallic layer (16) arranged at a top side or front side, respectively, of the non conductive layer (14), and a cut-out (18) formed in the metallic layer (16) and arranged at the non conductive layer (14) opposite to the touch sensor (12). The metallic layer (16) is connected to a ground connection (22). Further, the present invention relates to a control device for an electric
(Continued)

Figure 3:
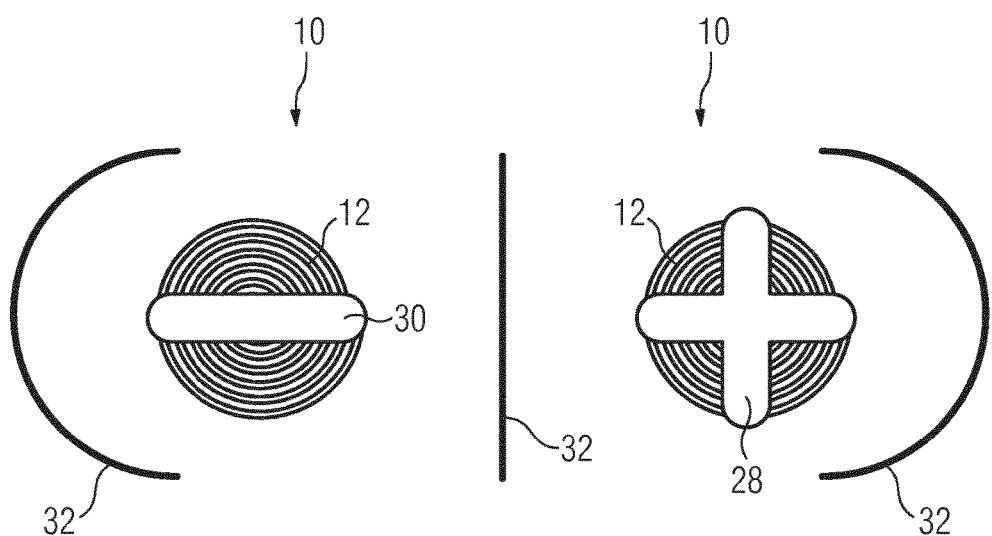

and/or electronic apparatus. Moreover, the present invention relates to an electric and/or electronic apparatus, in particular a domestic appliance.

16 Claims, 2 Drawing Sheets

(58) Field of Classification Search
USPC .......................................... 345/173; 200/600
See application file for complete search history.

(56) References Cited

U.S. PATENT DOCUMENTS

| | | | | |
|---|---|---|---|---|
| 6,310,611 | B1* | 10/2001 | Caldwell | H03K 17/955 |
| | | | | 178/18.06 |
| 8,164,030 | B2* | 4/2012 | Isoda | F24C 7/082 |
| | | | | 200/600 |
| 9,490,803 | B2* | 11/2016 | Orellana | H03K 17/962 |
| 9,495,010 | B2* | 11/2016 | Radivojevic | G06F 3/044 |
| 2011/0122082 | A1 | 5/2011 | Orellana | |
| 2013/0106774 | A1 | 5/2013 | Radivojevic et al. | |
| 2014/0346029 | A1* | 11/2014 | Sekizawa | G06F 3/044 |
| | | | | 200/600 |
| 2015/0049051 | A1* | 2/2015 | Stone | G06F 3/044 |
| | | | | 345/174 |
| 2017/0192569 | A1* | 7/2017 | Jeon | G06F 3/0412 |

FOREIGN PATENT DOCUMENTS

| | | |
|---|---|---|
| DE | 102004026836 A1 | 12/2005 |
| EP | 2043407 A1 | 4/2009 |

OTHER PUBLICATIONS

English Translation of Office action issued in counterpart Chinese patent application No. 201480039559.3 dated Jan. 29, 2018, 12 pages.

* cited by examiner

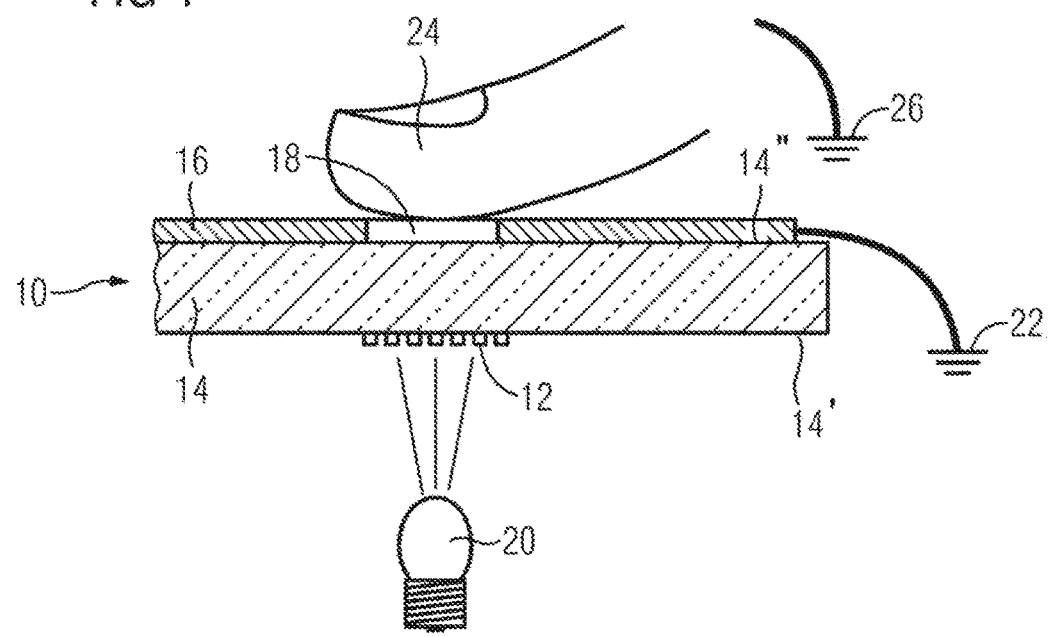
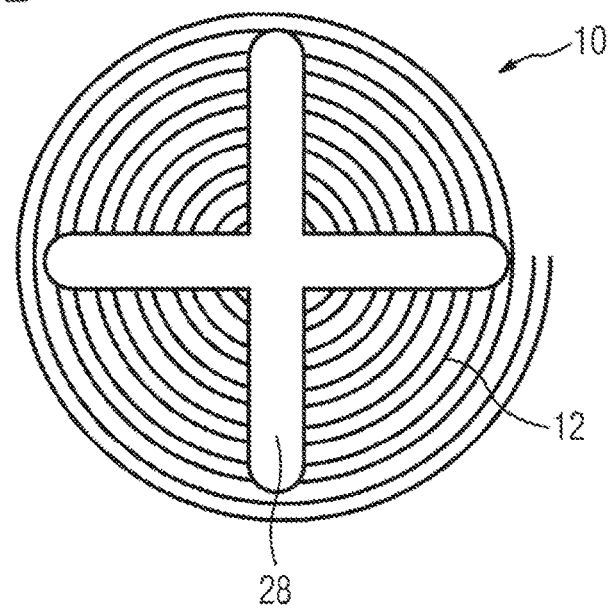

TOUCH SWITCH FOR A CONTROL DEVICE OF AN ELECTRIC AND/OR ELECTRONIC APPARATUS

The present invention relates to a touch switch for a control device of an electric and/or electronic apparatus. Further, the present invention relates to a control device for an electric and/or electronic apparatus. Moreover, the present invention relates to an electric and/or electronic apparatus, in particular a domestic appliance.

An example of a touch switch includes a metal sheet detecting the force applied by the finger of the user onto a button of said touch switch. The touch switch may include a piezo element for measuring the pressure of the finger. Such a touch switch includes mechanical components being usually liable to wear. Another example of the touch switch comprises a metal part electrically isolated from the rest of the front panel. However, it is relative expensive and difficult to isolate these metal part form the rest of the front panel.

It is an object of the present invention to provide a touch switch for a control device of an electric and/or electronic apparatus, wherein the touch switch is realized by low complexity.

The object of the present invention is achieved by the touch switch according to claim 1.

The present invention relates to a touch switch for a control device of an electric and/or electronic apparatus, wherein said touch switch comprises:
a layer made of an electrically non-conductive material or material composition,
a touch sensor arranged at a bottom side or rear side of the non conductive layer,
a metallic layer arranged at a top side or front side, respectively, of the non conductive layer, and
a cut-out formed in the metallic layer and arranged at the non conductive layer opposite to the touch sensor, wherein
the metallic layer is connected to a ground connection.

The main idea of the touch switch according to the present invention is the metallic layer with the cut-out above or in front of the touch sensor on the one hand and the connection of the metallic layer to the ground connection on the other hand. Further, the layer made of the electrically non-conductive material is arranged below or behind the cut-out. The connection of the metallic layer to the ground connection allows that the finger of the user and the metallic layer have the same electric potential, since usually the human body of the user is directly or indirectly connected to the ground connection. The cut-out may be formed as a symbol and/or an alphanumeric sign. The layer made of an electrically non-conductive material can be a transparent layer or a non-transparent layer or a layer having a defined opacity.

Preferably, the metallic layer is formed as a single-piece part. The metallic layer formed as single-piece part allows a low complexity and requires only one connecting line to the ground connection.

Further, (optional) at least one light source element is arranged below or behind, respectively, the touch sensor and/or the, preferably transparent, layer extends within and/or below the cut out. Since the light source element is arranged below or behind the cut-out and the non conductive layer, the touch switch can be illuminated independent of the operation by the user. In particular, when an transparent layer is used, its structure colour may be different from the front panel. Thus, the user of the appliance knows intuitively where to put his finger(s) to active the switch.

Moreover, the touch sensor is at least partially transparent for the light from the light source element. The partially or completely transparent touch sensor makes a contribution to the independent illumination of the touch switch.

According to one embodiment of the present invention, the touch sensor is a capacitive sensor and includes at least two electrodes. In this case, both electrodes of the capacitor are arranged below or behind, respectively, the non conductive layer.

According to another embodiment of the present invention, the touch sensor is a part of a capacitive sensor and forms a first electrode, wherein the metallic layer forms a second electrode. In this case, the electrodes of the capacitor are arranged at both side of the non conductive layer.

According to a further embodiment of the present invention, the touch sensor is an inductive sensor and includes at least one coil.

In another example of the present invention, the touch sensor is an optical sensor.

In a similar way, the touch sensor may be an infrared sensor.

In general, the touch sensor works with an electromagnetic field and/or electromagnetic radiation, since the non conductive layer and the cut-out are permeable for electromagnetic fields and/or electromagnetic radiation.

Moreover, the touch switch may comprise at least one identification mark indicating the area, which has to be touched by the user in order to actuate the touch switch.

Further, the present invention relates to a control device for an electric and/or electronic apparatus including at least one touch switch, wherein the control device includes at least one touch switch mentioned above.

In particular, the control device includes a number of touch switches, wherein at least a part of said touch switches comprises a common metallic layer formed as a single-piece part.

Furthermore, the control device may comprise a number of identification marks indicating the areas, which have to be touched by the user in order to actuate the corresponding touch switch.

At last, the present invention relates to an electric and/or electronic apparatus, particular a domestic appliance, wherein the electric and/or electronic apparatus includes at least one touch switch and/or at least one control device mentioned above.

Further features, embodiments and advantages of the present invention are set forth in the appended claims.

The present invention will be described in further detail with reference to the drawings, in which FIG. 1 illustrates a schematic sectional side view of a touch switch according to a preferred embodiment of the present invention, FIG. 2 illustrates a schematic top view of the touch switch according to the preferred embodiment of the present invention, and FIG. 3 illustrates a schematic top view of two neighboured touch switches of a control device according to the preferred embodiment of the present invention.

FIG. 1 illustrates a schematic sectional side view of a touch switch 10 according to a preferred embodiment of the present invention. The touch switch 10 may form a part of a control device of an electric and/or electronic apparatus. For example, the touch switch 10 and/or the control device are provided for a domestic appliance.

The touch switch 10 comprises a touch sensor 12, a non conductive layer 14 and a metallic layer 16. The non conductive layer 14 is made of an electrically non-conductive material. The touch sensor 12 is arranged at a bottom side 14' or at a rear side of the non conductive layer 14. The metallic layer 16 is arranged at a top side or a front side 14" of the transparent or non transparent layer 14. In FIG. 1 the non conductive layer 14 and the metallic layer 16 extend in a horizontal plane, so that the touch sensor 12 is arranged at the bottom side 14' and the metallic layer 16 is arranged at the top side 14" of the non conductive layer 14. In another embodiment the non conductive layer 14 and the metallic layer 16 may extend in a vertical plane, so that the touch sensor 12 would be arranged at the rear side and the metallic layer 16 at the front side of the non conductive layer 14.

The metallic layer 16 includes a cut-out 18 arranged opposite to the touch sensor 12. The cut-out 18 may be optionally filled with a transparent or not transparent but non conductive material in order to obtain a smooth surface on the outer side or front side of the metallic layer 14. Further, a light source element 20 may be optionally arranged below or behind the touch sensor 12. For example, the light source element 20 is a bulb or a light emitting diode (LED).

The metallic layer 16 is connected to a first ground connection 22. Above the cut-out 18 a finger 24 of a user is shown. Since the human body of the user is usually connected to the floor, the finger 24 is factually connected to a second ground connection 26. The connection of the metallic layer to the first ground connection 22 allows that the finger 24 of the user and the metallic layer 16 have the same electric potential.

The touch sensor 12 reacts to the finger 24, if said finger 24 is close to the touch sensor 12. For example, the touch sensor 12 may be a capacitive or an inductive sensor. In general, the touch sensor 12 changes its physical and/or electric properties, when the finger 24 approaches said touch sensor 12. The touch sensor 12 is transparent or partially transparent or non transparent, so that the light from the light source element 20 can pass the touch sensor 12, the non conductive layer 14 and as the case may be the transparent material within the cut-out 18. Thus, the light from the light source element 20 can shine to the top side 14" or front side of the touch switch 10, while the touch sensor 12 is able to detect the presence of the finger 24.

For example, the touch sensor 12 may be a capacitive sensor and includes two or more electrodes, wherein said electrodes of the capacitor are arranged below or behind, respectively, the non conductive layer 14.

In another example, the touch sensor 12 may be a part of a capacitive sensor and forms a first electrode, wherein the metallic layer forms a second electrode. In this case, the electrodes of the capacitor are arranged at both sides of the non conductive layer 14.

Further, the touch sensor 12 may be an inductive sensor, an optical sensor or an infrared sensor.

In general, the touch sensor 12 works with an electromagnetic field and/or electromagnetic radiation. The non conductive layer 14 and the cut-out 18 are permeable for electromagnetic fields and/or electromagnetic radiation.

FIG. 2 illustrates a schematic top view of the touch switch 10 according to the preferred embodiment of the present invention.

The touch switch 10 includes the touch sensor 12 and a first cut-out 28. In this example, the first cut-out 28 is formed as a plus sign. The touch sensor 12 is arranged at the bottom side 14' or rear side, respectively, of the non conductive layer 14. The first cut-out 28 is formed in the metallic layer 16, so that there is no metal inside, above and upon said first cut-out 28. Thus, an electric field of the touch sensor 12 can pass through the non conductive layer 14 and the first cut-out 28 in the metallic layer 16. The touch sensor 12 is able to detect the proximity of the finger 24, even if said finger 24 touches the metallic layer 16 around the first cut-out 28. The first cut-out 28 may be optionally filled with the transparent or intransparant but non-conductive material in order to obtain the smooth surface on the outer side or front side, respectively, of the metallic layer 14.

For example, the conductive material of the touch sensor 12 is made of copper. The ratio between the cut out 18 of the metalic layer and the touch sensor 12 should be such the touch system is able to detect the presence of the finger by measuring the influence of the finger on the electrical parameters of the touch sensor system that FIG. 3 illustrates an example of an schematic top view of two neighboured touch switches 10 of a control device according to the preferred embodiment of the present invention.

The control device comprises at least two neighboured touch switches 10. Each touch switch 10 includes a touch sensor 12. The touch switch 10 on the right hand side includes the first cut-out 28. In a similar way, the touch switch 10 on the left hand side includes a second cut-out 30. The first cut-out 28 is formed as the plus sign, while the second cut-out 30 is form as a minus sign. Further, the control device comprises three identification marks 32 indicating the areas, which have to be touched by the user in order to actuate the touch switches 10 on the left hand side and right hand side, respectively. In this example, the identification marks 32 are boundary lines. The identification marks 32 may be made by laser cutting.

The touch switch 10 according to the present invention has the advantage that the metallic layer 16 of the whole control device can be formed as a single-piece part. There is no need for any insulating elements on the front side of the touch switch 10 and control device.

LIST OF REFERENCE NUMERALS 10 touch switch
12 touch sensor
14 non conductive layer
14' bottom side of non conductive layer
14" top side of non conductive layer
16 metallic layer
18 cut-out
20 light source element
22 first ground connection
24 finger
26 second ground connection
28 first cut-out
30 second cut-out
32 identification mark

The invention claimed is:

1. A touch switch for a control device of an electric and/or electronic apparatus, wherein said touch switch comprises:
a first layer made of an electrically non-conductive material or material composition,
a touch sensor arranged at a bottom side of the first layer,
a metallic layer arranged at a top side of the first layer, and
a cut-out formed in the metallic layer and arranged opposite to the touch sensor relative to the first layer, wherein:
the metallic layer is connected to a ground connection, and the cut-out is filled with a non-conductive material, wherein a top surface of the metallic layer and a top surface of the non-conductive material together define a smooth surface.

2. The touch switch according to claim 1, wherein the metallic layer is formed as a single-piece part.

3. The touch switch according to claim 1, wherein at least one light source element is arranged below the first layer, the first layer is transparent, and the touch sensor and/or the first layer is transparent and extend within and/or below the cut-out.

4. The touch switch according to claim 3, wherein
the touch sensor is at least partially transparent for the light from the light source element.

5. The touch switch according to claim 1, wherein the touch sensor is a capacitive sensor and includes at least two electrodes.

6. The touch switch according to claim 1,
wherein the touch sensor is a part of a capacitive sensor and forms a first electrode, and
wherein the metallic layer forms a second electrode.

7. The touch switch according to claim 1,
wherein the touch sensor is an inductive sensor and includes at least one coil.

8. The touch switch according to claim 1, wherein the touch sensor is an optical sensor.

9. The touch switch according to claim 1, wherein the touch sensor is an infrared sensor.

10. The touch switch according to claim 1, wherein the touch switch comprises at least one identification mark indicating the area which has to be touched by a user in order to actuate the touch switch.

11. A control device of an electric and/or electronic apparatus including at least one touch switch according to claim 1.

12. The control device according to claim 11, wherein the control device includes a number of touch switches, and wherein at least a part of said touch switches comprises a common metallic layer formed as a single-piece part.

13. The control device according to claim 11, wherein the control device comprises a number of identification marks indicating areas which have to be touched by a user in order to actuate a corresponding touch switch.

14. An electric and/or electronic apparatus including at least one touch switch according to claim 1, wherein the electric and/or electronic apparatus is a domestic appliance.

15. The touch switch according to claim 1, wherein a structure or color of the non-conductive material used to fill the cut-out is different from the structure or the color of the front panel, to indicate to a user of the control device where to put his or her finger to active the touch switch.

16. The touch switch according to claim 1, wherein a height of the metallic layer is equal to the height of the non-conductive material.

* * * * *